(12) United States Patent
Li

(10) Patent No.: US 11,751,412 B2
(45) Date of Patent: *Sep. 5, 2023

(54) QUANTUM DOT LIGHT-EMITTING DEVICE AND PREPARATION METHOD THEREOF

(71) Applicants: Beijing BOE Technology Development Co., Ltd., Beijing (CN); BOE Technology Group Co., Ltd., Beijing (CN)

(72) Inventor: Dong Li, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/692,446

(22) Filed: Mar. 11, 2022

(65) Prior Publication Data

US 2022/0199927 A1  Jun. 23, 2022

Related U.S. Application Data

(63) Continuation of application No. 16/764,470, filed as application No. PCT/CN2019/125757 on Dec. 16, 2019, now Pat. No. 11,309,504.

(30) Foreign Application Priority Data

Jan. 11, 2019  (CN) .......................... 201910027598.6

(51) Int. Cl.
*H01L 23/00* (2006.01)
*H10K 50/115* (2023.01)
(Continued)

(52) U.S. Cl.
CPC ............ *H10K 50/115* (2023.02); *H10K 50/11* (2023.02); *H10K 50/15* (2023.02); *H10K 50/16* (2023.02);
(Continued)

(58) Field of Classification Search
CPC ... H10K 50/115; H10K 50/11; H10K 2101/40
See application file for complete search history.

(56) References Cited

U.S. PATENT DOCUMENTS 11,309,504 B2 *  4/2022  Li .................... H01L 51/5072
2007/0159087 A1   7/2007  Lee et al.
(Continued)

FOREIGN PATENT DOCUMENTS

CN  101253578 A  8/2008
CN  104124370 A  10/2014
(Continued)

OTHER PUBLICATIONS

ESSR for corresponding European Application 19908288.4 issued on Sep. 5, 2022.
Non Final Office Action in U.S. Appl. No. 16/764,470 dated Sep. 9, 2021.
Restriction Requirement n in U.S. Appl. No. 16/764,470 dated Jun. 29, 2021.

*Primary Examiner* — Anthony Ho
(74) *Attorney, Agent, or Firm* — ArentFox Schiff LLP; Michael Fainberg

(57) ABSTRACT

The present disclosure relates to the technical field of display, and discloses a quantum dot light-emitting device and a preparation method thereof. The quantum dot light-emitting device includes a first electrode layer, a quantum dot light-emitting layer, an electron transport layer, a second electrode layer and a third electrode layer which are sequentially arranged in a stacked manner, wherein the side, facing away from the first electrode layer, of the third electrode layer is configured as a light exiting side; the second electrode layer and the third electrode layer are transparent (Continued)

electrode layers; and the work function of the second electrode layer is greater than the LUMO energy level of the electron transport layer and smaller than the work function of the third electrode layer.

20 Claims, 6 Drawing Sheets

(51) Int. Cl.
  *H10K 50/11*   (2023.01)
  *H10K 50/15*   (2023.01)
  *H10K 50/16*   (2023.01)
  *H10K 71/00*   (2023.01)
  *H10K 101/40*  (2023.01)
(52) U.S. Cl.
  CPC ......... *H10K 71/00* (2023.02); *H10K 2101/40* (2023.02)

(56) References Cited

U.S. PATENT DOCUMENTS

| | | |
|---|---|---|
| 2009/0153032 A1 | 6/2009 | Tomai et al. |
| 2015/0228850 A1 | 8/2015 | Zheng et al. |
| 2019/0148666 A1 | 5/2019 | Li et al. |
| 2019/0288044 A1 | 9/2019 | Hou |
| 2019/0288225 A1 | 9/2019 | Chen et al. |

FOREIGN PATENT DOCUMENTS

| | | |
|---|---|---|
| CN | 108281562 A | 7/2018 |
| CN | 108447988 A | 8/2018 |
| CN | 109659450 A | 4/2019 |
| WO | 2019001317 A1 | 3/2019 |

* cited by examiner (a)

(b)

(a)

(b)

QUANTUM DOT LIGHT-EMITTING DEVICE AND PREPARATION METHOD THEREOF

CROSS REFERENCE TO RELATED APPLICATIONS

The present disclosure is a continuation of U.S. patent application Ser. No. 16/764,470 filed with USPTO on May 15, 2020. The U.S. patent application Ser. No. 16/764,470 is a National Stage of International Application No. PCT/CN2019/125757, filed on Dec. 16, 2019, claims priority to Chinese Patent Application entitled 'QUANTUM DOT LIGHT-EMITTING DEVICE PREPARATION METHOD AND QUANTUM DOT LIGHT-EMITTING DEVICE' filed on Jan. 11, 2019 by the Chinese Patent Office with Application No. 201910027598.6, the entire contents of which are incorporated herein by reference.

FIELD

The present disclosure relates to the technical field of display, in particular to a quantum dot light-emitting device and a preparation method thereof.

BACKGROUND

As a novel light-emitting material, a quantum dot QD has the advantages of high light color purity, high light-emitting quantum efficiency, adjustable light-emitting color, long service life and the like, and becomes a research hotspot of the current novel LED light-emitting material. Therefore, a quantum dot light-emitting diode QLED using the quantum dot material as a light-emitting layer becomes the main direction of the research of a novel display device at present.

SUMMARY

The present disclosure provides a quantum dot light-emitting device includes a first electrode layer, a quantum dot light-emitting layer, an electron transport layer, a second electrode layer and a third electrode layer which are sequentially arranged in a stacked mode, and the side, away from the first electrode layer, of the third electrode layer is configured as a light exiting side; and the second electrode layer and the third electrode layer are transparent electrode layers, and the work function of the second electrode layer is larger than the LUMO energy level of the electron transport layer and smaller than the work function of the third electrode layer.

Optionally, the oxygen content of the material of the second electrode layer is smaller than the oxygen content of the material of the third electrode layer.

Optionally, the thickness of the second electrode layer is smaller than that of the third electrode layer.

Optionally, the thickness of the second electrode layer is 5%-20% of the thickness of the thickness of the third electrode layer.

Optionally, the thickness of the second electrode layer is 1 nm-10 nm; and the thickness of the third electrode layer is 60 nm-100 nm.

Optionally, the second electrode layer is an indium zinc material with the oxygen content being 0; and the third electrode layer is an indium zinc oxide material.

Optionally, the material of the electron transport layer is zinc oxide nanoparticles or zinc oxide nanoparticles doped with magnesium.

Optionally, the quantum dot light-emitting device further includes a hole injection layer and a hole transport layer which are positioned between the first electrode layer and the quantum dot light-emitting layer; and the hole injection layer is positioned between the first electrode layer and the hole transport layer.

Optionally, the material of the hole injection layer is an organic injection material or an inorganic oxide.

Optionally, the material of the hole transport layer is an organic transport material or an inorganic oxide.

Optionally, the quantum dot light-emitting device further includes a base substrate; the base substrate is positioned on the side, away from the third electrode layer, of the first electrode layer, or the base substrate is positioned on the side, away from the first electrode layer, of the third electrode layer.

The present disclosure further provides a preparation method of the quantum dot light-emitting device includes:

respectively preparing a first electrode layer, a quantum dot light-emitting layer, an electron transport layer, a second electrode layer and a third electrode layer, the first electrode layer, the quantum dot light-emitting layer, the electron transport layer, the second electrode layer and the third electrode layer are sequentially stacked, and configuring the side, away from the first electrode layer, of the third electrode layer as a light exiting side; wherein the second electrode layer and the third electrode layer are transparent electrode layers, and the work function of the second electrode layer is greater than the LUMO energy level of the electron transport layer and smaller than the work function of the third electrode layer.

Optionally, preparation of the second electrode layer and the third electrode layer includes:

depositing the second electrode layer and third electrode layer in a sputtering mode, wherein the flow of oxygen fed during sputtering of the second electrode layer is smaller than the flow of oxygen fed during sputtering of the third electrode layer.

Optionally, preparation of the second electrode layer includes:

depositing an indium zinc oxide film in a sputtering mode, wherein the flow of oxygen is about 0 sccm to 0.2 sccm and the flow of inert gas is about 40 sccm to 60 sccm during sputtering.

Optionally, preparation of the third electrode layer includes:

depositing an indium zinc oxide film in a sputtering mode, wherein the flow of oxygen is about 0.5 sccm to 2 sccm and the flow of inert gas is about 40 sccm to 60 sccm during sputtering.

Optionally, the preparation method further includes:

respectively preparing a hole injection layer and a hole transport layer; wherein the hole injection layer and the hole transport layer are positioned between the first electrode layer and the quantum dot light-emitting layer, and the hole injection layer is positioned between the first electrode layer and the hole transport layer.

DETAILED DESCRIPTION OF THE EMBODIMENTS

Technical solutions in embodiments of the present disclosure will be described clearly and completely hereinafter in conjunction with the accompanying drawings in embodiments of the present disclosure, and obviously, the described embodiments are only a part of, but not all, embodiments of the present disclosure. Based on the embodiments of the present disclosure, all other embodiments obtained by those skilled in the art without creative work belong to the scope of protection of the present disclosure.

Figure 1:
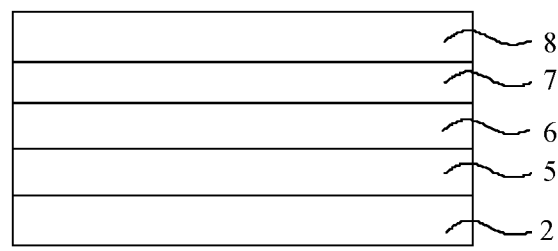
FIG. 1 is a structure diagram of a quantum dot light-emitting device provided by an embodiment of present disclosure.
Figure 2:
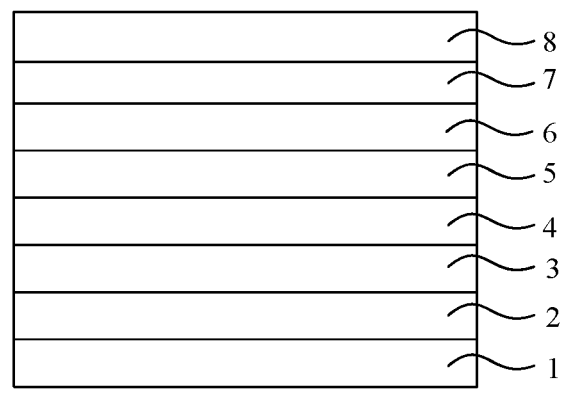
FIG. 2 is a structure diagram of the quantum dot light-emitting device provided by another embodiment of the present disclosure.
Figure 3:
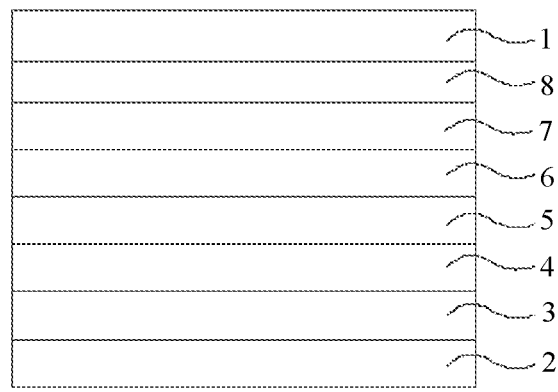
FIG. 3 is a structure diagram of the quantum dot light-emitting device provided by another embodiment of the present disclosure.

As shown in FIG. 1 to FIG. 3, the present disclosure provides a quantum dot light-emitting device, the quantum dot light-emitting device includes a first electrode layer 2, a quantum dot light-emitting layer 5, an electron transport layer 6, a second electrode layer 7 and a third electrode layer 8 which are sequentially arranged in a stacked manner. Specifically, the side, away from the first electrode layer 2, of the third electrode layer 8 is configured as a light exiting side, the second electrode layer 7 and the third electrode layer 8 are transparent electrode layers, and the work function of the second electrode layer 7 is greater than the LUMO energy level of the electron transport layer 6 and smaller than the work function of the third electrode layer 8. Optionally, each transparent electrode layer is an electrode layer prepared from transparent conductive oxide materials such as an indium tin oxide (ITO), an indium zinc oxide (IZO) and a fluorine-doped tin oxide (FTO).

According to the quantum dot light-emitting device provided by the embodiment of the present disclosure, the second electrode layer is arranged on the electron transport layer, the third electrode layer is arranged on the second electrode layer, the second electrode layer and the third electrode layer are configured as light exiting side electrode structures, the second electrode layer and the third electrode layer are both transparent electrode layers, and therefore, compared with a conventional structure adopting a metal film as a light exiting side electrode, the quantum dot light-emitting device is higher in light exiting efficiency; and moreover, the work function of the second electrode layer is smaller than the work function of the third electrode layer, so that the work function of the second electrode layer is closer to the LUMO energy level of the electron transport layer, injection of electrons is facilitated, the work function of the third electrode layer is larger, the transmittance is higher, the transmittance of the light exiting side electrode is improved favorably, and the light extraction efficiency is further improved.

Further, the second electrode layer and the third electrode layer are transparent electrode layers and have a weak microcavity effect, and the defects that the microcavity structure cannot be accurately controlled due to the fact that inorganic materials such as quantum dots form a film by adopting a solution process and the film thickness uniformity is insufficient are overcome.

In conclusion, the quantum dot light-emitting device provided by the embodiment of the present disclosure is relatively good in light-emitting performance and relatively high in light exiting efficiency.

Figure 4:
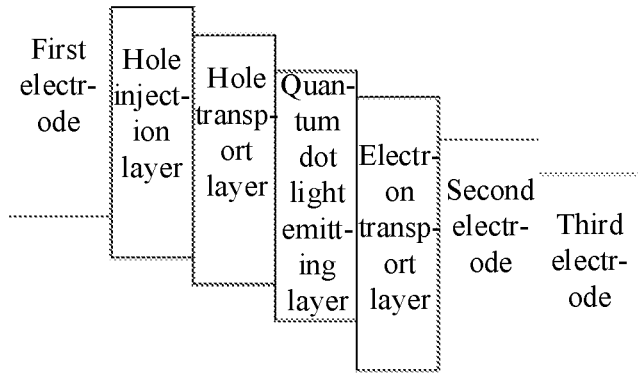
FIG. 4 is a structure diagram of an energy level structure of the quantum dot light-emitting device provided by an embodiment of the present disclosure.

As shown in FIG. 2 and FIG. 3, in a specific embodiment, the quantum dot light-emitting device provided by the present disclosure further includes a hole injection layer 3 and a hole transport layer 4 which are positioned between the first electrode layer 2 and the quantum dot light-emitting layer 5; wherein the hole injection layer 3 is positioned between the first electrode layer 2 and the hole transport layer 4. The quantum dot light-emitting device provided by the present disclosure includes a first electrode layer 2, a hole injection layer 3, a hole transport layer 4, a quantum dot light-emitting layer 5, an electron transport layer 6, a second electrode layer 7 and a third electrode layer 8 which are sequentially arranged in a stacked manner. FIG. 4 is a structure diagram of the energy level structure of the quantum dot light-emitting device. The energy levels of the hole injection layer 3, the hole transport layer 4, the quantum dot light-emitting layer 5 and the electron transport layer 6 are sequentially reduced, the work function of the second electrode layer 7 is smaller than that of the third electrode layer 8 and is closer to the LUMO energy level of the electron transport layer 6, and the work function of the third electrode layer 8 is larger than that of the second electrode layer 7 and greatly differs from the LUMO energy level of the electron transport layer 6. As can be seen from FIG. 4, the work function of the second electrode layer 7 is larger than the LUMO energy level of the quantum dot light-emitting layer 5 and smaller than the work function of the third electrode layer 8. The value of the energy level (including the LUMO energy level of the hole injection layer 3, the hole transport layer 4, the quantum dot light-emitting layer 5 and the electron transport layer 6, and the Fermi energy level of the first electrode layer 2, the second electrode layer 7, and the third electrode layer 8 as shown in FIG. 4) is a negative number. The value of the work function is an absolute value of the Fermi energy level.

Optionally, the oxygen content of the material of the second electrode layer 7 is smaller than that of the material of the third electrode layer 8.

Optionally, the second electrode layer 7 is made of an indium zinc oxide material; and the third electrode layer 8 is made of an indium zinc oxide material.

Optionally, the transmittances and the work functions of the indium zinc oxide films with different oxygen contents are different, and the work function of the indium zinc oxide film (the second electrode layer) with low oxygen content in the quantum dot light-emitting device is close to the LUMO energy level of the electron transport layer, so that injection of electrons is facilitated; and the transmittance of the indium zinc oxide film (the third electrode layer) with high oxygen content is higher than that of the indium zinc oxide film (the second electrode layer) with low oxygen content, so that the transmittance of the indium zinc oxide film is favorably improved, and the light extraction efficiency is further improved.

Optionally, the thickness of the second electrode layer 7 is smaller than that of the third electrode layer 8.

Optionally, the thickness of the second electrode layer 7 is 5%-20% of the thickness of the third electrode layer 8.

Optionally, the thickness of the second electrode layer 7 is 1 nm-10 nm; and the thickness of the third electrode layer 8 is 60 nm-100 nm. Exemplarily, the thickness of the second electrode layer 7 may be 10 nm; and the thickness of the third electrode layer 8 may be 80 nm.

In a specific embodiment, the quantum dot light-emitting device provided by the present disclosure further includes a base substrate; optionally, as shown in FIG. 2, the base substrate 1 may be positioned on the side, facing away from the third electrode layer 8, of the first electrode layer 2; alternatively, as shown in FIG. 3, the base substrate 1 may also be positioned on the side, facing away from the first electrode layer 2, of the third electrode layer 8. That is, the quantum dot light-emitting device provided by the present disclosure can be a bottom emitting device or a top emitting device.

In the quantum dot light-emitting device, the base substrate can be glass or a flexible PET base and the like, and the material of the base substrate is selected according to actual conditions and is not limited herein.

Optionally, the deposition material of the electron transport layer is preferably zinc oxide (ZnO) nanoparticles or zinc oxide (ZnO) nanoparticles doped with magnesium.

Optionally, the material of the first electrode layer is ITO/Ag/ITO; and of course, the material of the first electrode layer can also be a transparent indium tin oxide (ITO), a fluorine-doped tin oxide (FTO), a conductive polymer and the like or non-transparent metal electrodes such as aluminum (Al) and silver (Ag), and the material of the first electrode layer is selected according to actual conditions, and is not limited herein.

Optionally, the material of the hole injection layer can be an organic injection material, such as PEDOT: PSS, or can be an inorganic oxide, such as a molybdenum oxide ($MoO_x$) material, is selected according to actual conditions and is not limited herein.

Optionally, the material of the hole transport layer can be an organic transport layer material, such as polyvinyl carbazole (PVK), TFB and a tetraphenyl biphenyl diamine (TPD) compound, can also be an inorganic oxide, such as nickel oxide $(NiO)_x$ or vanadium oxide $(VO_x)$, is selected according to actual conditions and is not limited herein.

Based on the same inventive concept, the present disclosure also provides a preparation method of the quantum dot light-emitting device, and the preparation method includes the following steps:

a first electrode layer, a quantum dot light-emitting layer, an electron transport layer, a second electrode layer and a third electrode layer are prepared respectively, the first electrode layer, the quantum dot light-emitting layer, the electron transport layer, the second electrode layer and the third electrode layer are sequentially stacked, and the side, facing away from the first electrode layer, of the third electrode layer is configured as a light exiting side; wherein the second electrode layer and the third electrode layer are transparent electrode layers, and the work function of the second electrode layer is greater than the LUMO energy level of the electron transport layer and smaller than the work function of the third electrode layer.

According to the quantum dot light-emitting device obtained through the preparation method of the quantum dot light-emitting device, the light exiting side electrode structure includes a double-layered structure including the second electrode layer and the third electrode layer, and the second electrode layer and the third electrode layer are transparent electrode layers, so that compared with a conventional structure adopting a metal film as a light exiting side electrode, the quantum dot light-emitting device has the advantages that the light exiting efficiency is higher; moreover, because the work function of the second electrode layer is greater than the LUMO energy level of the electron transport layer and smaller than the work function of the third electrode layer, namely, the work function of the second electrode layer is smaller than the work function of the third electrode layer, the work function of the second electrode layer is closer to the LUMO energy level of the electron transport layer, injection of electrons is facilitated, the work function of the third electrode layer is relatively large, the transmittance is relatively high, the transmittance of a top electrode of the quantum dot light-emitting device is favorably improved, and the light extraction efficiency of the quantum dot light-emitting device is further improved.

Further, in the preparation method, the second electrode layer and the third electrode layer are prepared into the transparent electrode layers, so that the quantum dot light-emitting device has a weak microcavity effect, and the defect that the microcavity structure cannot be accurately controlled due to the fact that inorganic materials such as quantum dots form a film by adopting a solution process and the film thickness uniformity is insufficient is overcome.

In conclusion, the quantum dot light-emitting device obtained by the preparation method provided by the embodiment of the present disclosure is relatively good in light-emitting performance and relatively high in light exiting efficiency.

In a specific embodiment, the preparation method of the quantum dot light-emitting device provided by the present disclosure can further include the following step:

the hole injection layer and the hole transport layer are respectively prepared; and the hole injection layer and the hole transport layer are positioned between the first electrode layer and the quantum dot light-emitting layer, and the hole injection layer is positioned between the first electrode layer and the hole transport layer.

Figure 5:
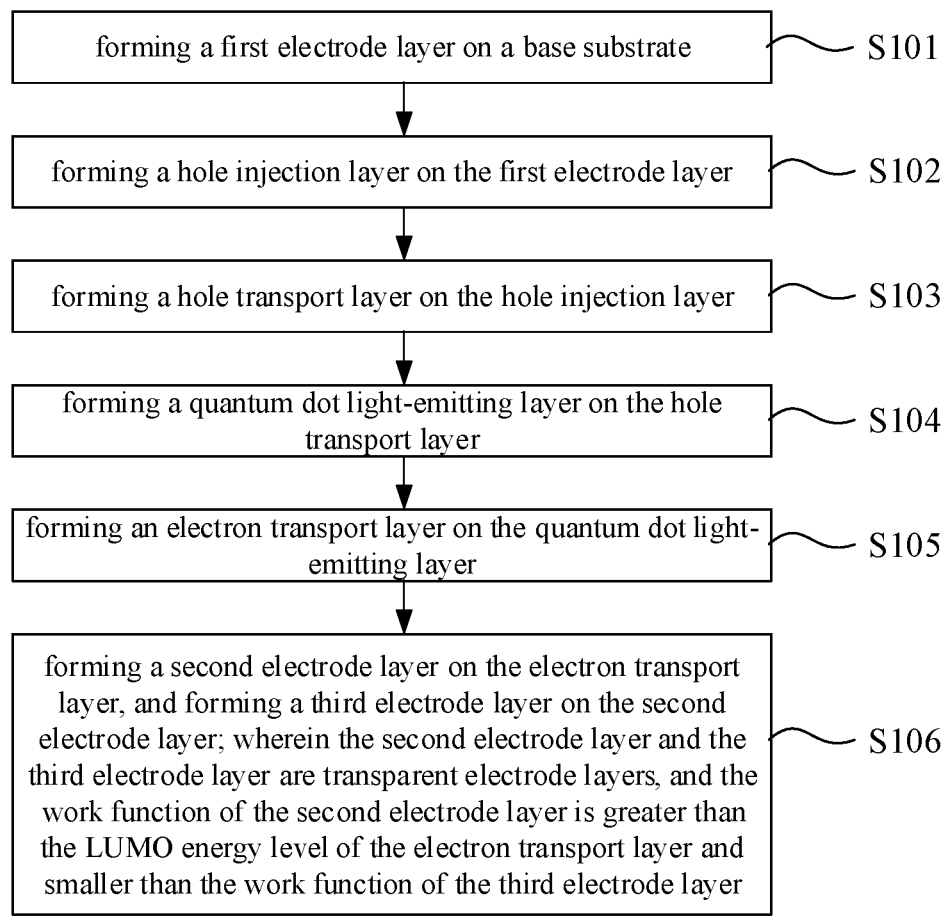
FIG. 5 is a flow chart of a preparation method of the quantum dot light-emitting device provided by an embodiment of the present disclosure.

Optionally, as shown in FIG. 5, the preparation method of the quantum dot light-emitting device provided by the present disclosure can specifically include the following steps:

S101: the first electrode layer is formed on the base substrate;

S102: the hole injection layer is formed on the first electrode layer;

S103: the hole transport layer is formed on the hole injection layer;

S104: the quantum dot light-emitting layer is formed on the hole transport layer;

S105: the electron transport layer is formed on the quantum dot light-emitting layer; and S106: the second electrode layer is formed on the electron transport layer, and the third electrode layer is formed on the second electrode layer; wherein the second electrode layer and the third electrode layer are transparent electrode layers, and the work function of the second electrode layer is greater than the LUMO energy level of the electron transport layer, and smaller than the work function of the third electrode layer.

Optionally, in the preparation method of the embodiment of the present disclosure, preparation of the second electrode layer and the third electrode layer may specifically include:

the second electrode layer and the third electrode layer are deposited in a sputtering manner, and the flow of oxygen fed during sputtering of the second electrode layer is smaller than that of oxygen fed during sputtering of the third electrode layer. The flow of the fed oxygen refers to the volume of the oxygen fed every minute.

Optionally, the second electrode layer can be a first indium zinc oxide film formed by sputtering deposition with low oxygen content; and the third electrode layer can be a second indium zinc oxide film formed by sputtering deposition with high oxygen content.

Optionally, the low oxygen content is about 0 sccm to 0.2 sccm. The high oxygen content is about 0.5 sccm to 2 sccm.

Optionally, in the manufacturing process, the ratio of oxygen to inert gas in the process gas, namely the oxygen content, is controlled by controlling the flow of oxygen.

Optionally, during sputtering deposition of the second electrode layer, the flow of oxygen is 0 sccm-0.2 sccm, and the flow of inert gas is 40 sccm-60 sccm; and during sputtering deposition of the third electrode layer, the flow of oxygen is 0.5 sccm-2 sccm, and the flow of inert gas is 40 sccm-60 sccm.

Optionally, in the preparation method of the embodiment of the present disclosure, preparation of the second electrode layer includes the following step:

an indium zinc oxide (IZO) film is deposited on the electron transport layer in a sputtering manner, during sputtering, the flow of oxygen is about 0 sccm to 0.2 sccm, and the flow of inert gas is about 40 sccm to 60 sccm, wherein 'about' means that the error range is within 20%, for example, in an actual operation process, the flow of oxygen may also be 2.1 sccm, 2.2 sccm, 2.3 sccm and 2.4 sccm; and the meaning of the following 'about' is the same as that of 'about' here.

Optionally, in the preparation method of the embodiment of the present disclosure, preparation of the third electrode layer includes the following step:

an indium zinc oxide (IZO) film is deposited on the second electrode layer in a sputtering manner, during sputtering, the flow of oxygen is about 0.5 sccm to 2 sccm, and the flow of inert gas is about 40 sccm to 60 sccm.

In the preparation method of the quantum dot light-emitting device, the inert gas can be argon.

In the preparation method of the quantum dot light-emitting device, the transmittances and the work functions of the indium zinc oxide films deposited by different flows of oxygen are different, wherein the work function of the IZO film deposited at the low flow of oxygen (0 sccm to 0.2 sccm) is close to the LUMO energy level of the electron transport layer, injection of electrons is facilitated, the transmittance of the IZO film deposited at the high flow of oxygen (0.5 sccm to 2 sccm) is higher than that of the IZO film deposited at the low flow of oxygen, the transmittance of the IZO film is improved favorably, and thus, the light extraction efficiency is improved.

Optionally, in the preparation method provided by the embodiment of the present disclosure, the sputtering time of the third electrode is longer than that of the second electrode. That is, the film thickness of the third electrode layer formed by sputtering is greater than the film thickness of the second electrode layer formed by sputtering.

In addition, in order to better illustrate the performance of the quantum dot light-emitting device provided by the present disclosure, the present disclosure also provides some specific experimental data.

Figure 6:
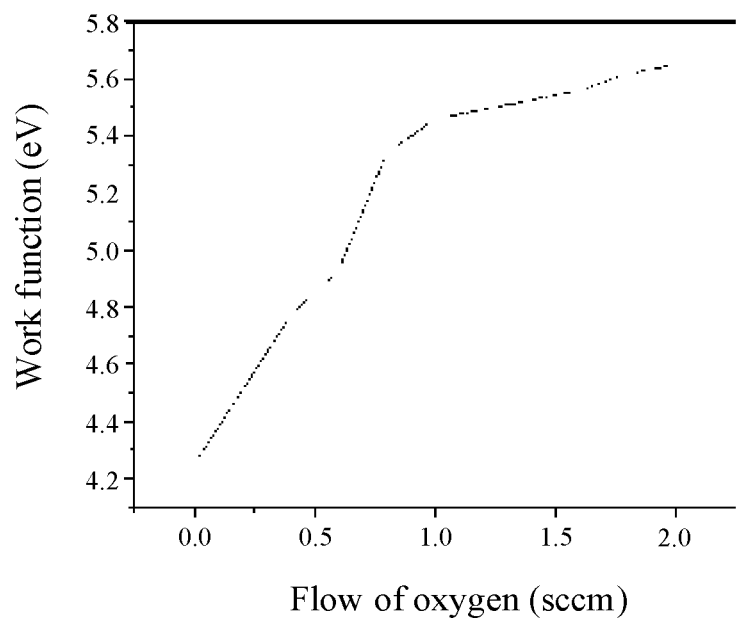
FIG. 6 is a relational graph of the flow of oxygen and the work function provided by an embodiment of the present disclosure.
Figure 7:
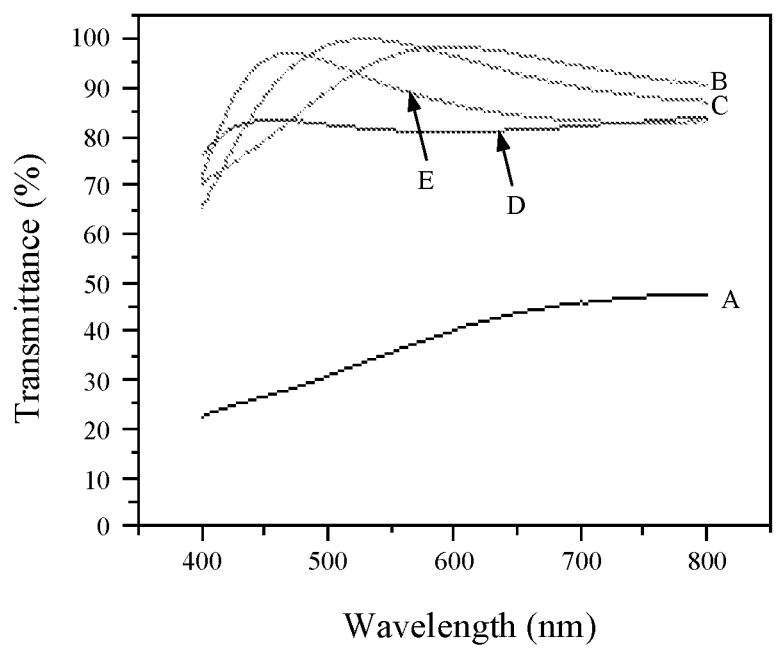
FIG. 7 is a change curve of transmittance of light with different wavelengths when the light passes through different indium zinc oxide films according to an embodiment of the present disclosure.

FIG. 6 represents a relational curve of the flow of oxygen fed in the indium zinc oxide film layer preparation process and the work function of the indium zinc oxide film layer obtained through experiments, and specifically shows a work function change curve of the flow of oxygen in a range of 0-2.0 sccm; FIG. 7 shows a change curve of the transmittance of light with different wavelengths when the light passes through different indium zinc oxide films, wherein process conditions of the indium zinc oxide films in the curve A are as follows: the working pressure is 0.4 Pa, the flow of oxygen is 0 sccm, the flow of argon is 40 sccm, and the process time is 1800 s; the process conditions of the indium zinc oxide films in the curve B are as follows: the working pressure is 0.4 Pa, the flow of oxygen is 0.8 sccm, the flow of argon is 40 sccm, and the process time is 1800 s; the process conditions of the indium zinc oxide films in the curve C are as follows: the working pressure is 0.4 Pa, the flow of oxygen is 1.6 sccm, the flow of argon is 40 sccm, and the process time is 1800 s; the process conditions of the indium zinc oxide films in the curve D are as follows: the working pressure is 0.6 Pa, the flow of oxygen is 1.6 sccm, the flow of argon is 40 sccm, and the process time is 1200 s; and the process conditions of the indium zinc oxide films in the curve E are as follows: the working pressure is 0.8 Pa, the flow of oxygen is 1.6 sccm, the flow of argon is 40 sccm, and the process time is 900 s. The process time corresponds to the thickness of the indium zinc oxide film, and it can be seen from FIG. 7 that the influence of the working pressure and the thickness of the film on the transmittance is not large, and the influence of the flow of oxygen on the transmittance is large.

Optionally, as shown in FIG. 6 and FIG. 7, when at the low flow of oxygen, for example, the flow of oxygen is 0 sccm (for example, curve A), the work function of the deposited IZO film is low, is about 4.2 eV, and is close to the LUMO energy level of the electron transport layer, injection of the electrons is facilitated, but the transmittance is only 30% to 40%, when at the high flow of oxygen, for example, the flow of oxygen is 1.6 sccm (for example, curves C, D and E), the work function of the deposited IZO film is about 5.6 eV, and greatly differs from the LUMO energy level of the electron transport layer, injection of the electrons is not facilitated, but the transmittance can reach 90% or above, therefore, the transparent top electrode is of a two-layer structure, a mode of depositing at the low flow of oxygen is adopted for the second electrode layer close to the electron transport layer in consideration of two factors of the energy level and the transmittance, injection of the electrons is facilitated, a mode of depositing at the high flow of oxygen is adopted for the third electrode layer, thus, the transmittance of the top electrode is favorably improved, and the light extraction efficiency of the top electrode is further improved.

In specific experimental data, the inventor also carries out comparative experimental analysis on the QLED device (the top electrode includes two IZO layers with different work functions) provided by the embodiment of the present disclosure and a conventional QLED device (the top electrode is a single IZO layer). Specifically, the same experimental conditions of the two QLED devices are as follows: the bottom electrode material is IZO/Ag/IZO, the hole injection layer (HI) and the hole transport layer (HT) are organic materials, the QD material is cadmium selenide (CdSe), and the electron transport layer (ETL) adopts zinc oxide nanoparticles. Differences between the two QLED devices are as follows.

In the conventional QLED device, the preparation conditions of the single IZO layer of the top electrode are as follows: the flow of argon is 40 sccm, the flow of oxygen is 2 sccm, the working pressure is 0.5 Pa, and the process time is 20-30 min.

Figure 8:
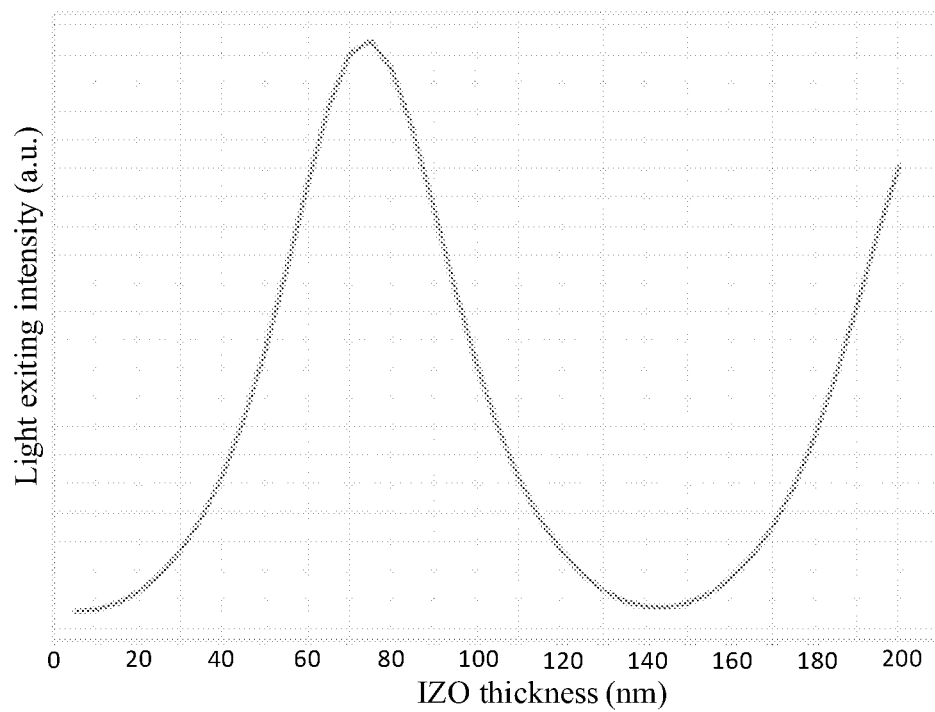
FIG. 8 is a curve graph of change of light exiting intensity of a QLED device along with change of thickness of a second electrode layer.

According to the QLED device provided by the embodiment of the present disclosure, in the two IZO layers of the top electrode, the layer close to the ETL is IZO1, the layer away from the ETL is IZO2, wherein the preparation conditions of IZO1 are as follows: the flow of argon is 40 sccm, the flow of oxygen is 0 sccm, the working pressure is 0.5 Pa, the process time is 2-5 min, and the thickness is 10 nm; and the preparation conditions of IZO2 are as follows: the flow of argon is 40 sccm, the flow of oxygen is 2 sccm, the working pressure is 0.5 Pa, the process time is 20-30 min, and the thickness is 80 nm. As shown in FIG. 8, the thickness of the IZO2 film and the light exiting intensity of the QLED device are in multi-sine wave distribution through optical simulation, and the peak of the sine wave is gradually reduced, wherein the maximum central peak of wave is 80 nm, that is, when the thickness of the IZO2 film is 80 nm, the light exiting efficiency is the highest.

Figure 9:
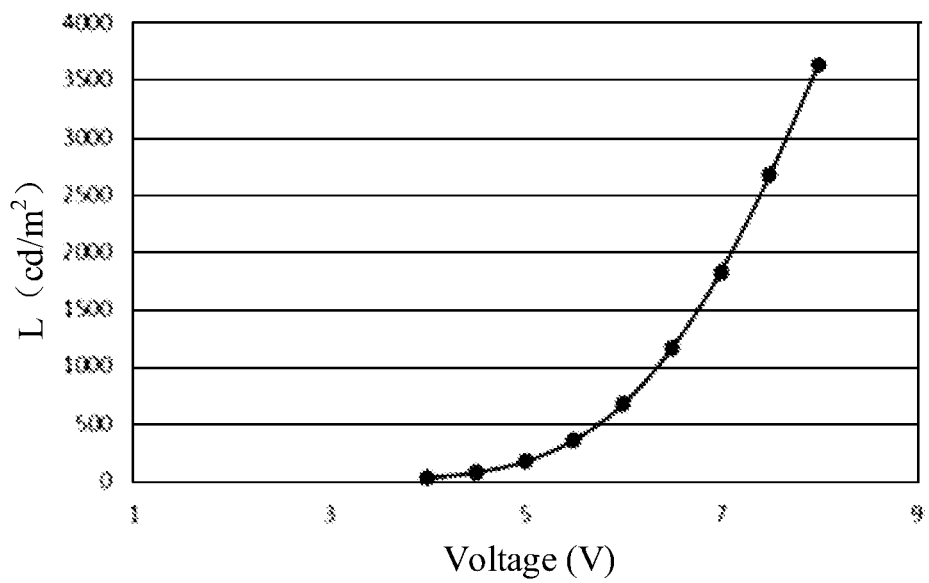
FIG. 9 is a curve graph of change of light exiting brightness of the QLED device along with change of working voltage.
Figure 9:
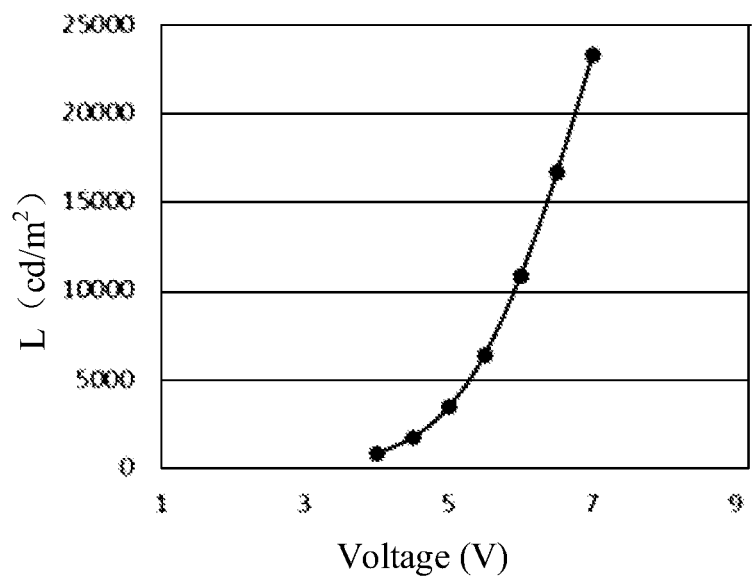
Figure 10:
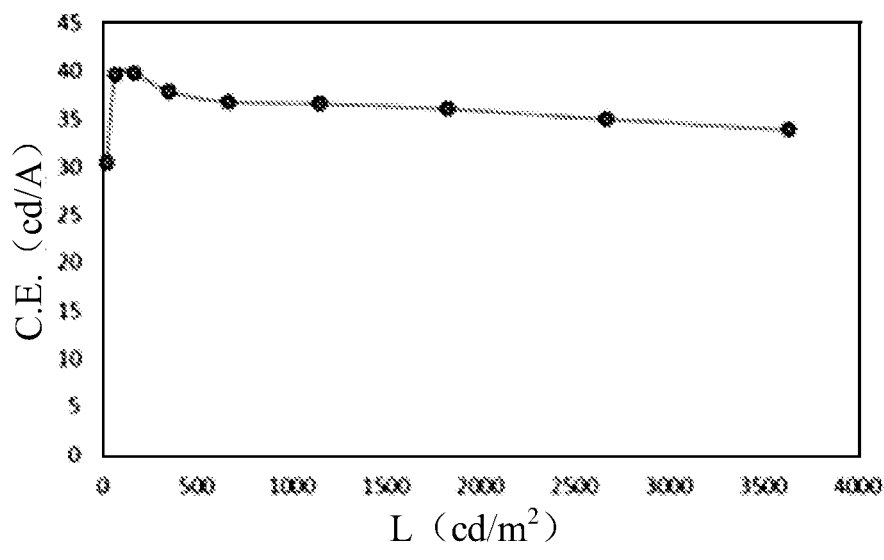
FIG. 10 is a curve graph of change of current efficiency of the QLED device along with change of the light exiting brightness.
Figure 10:
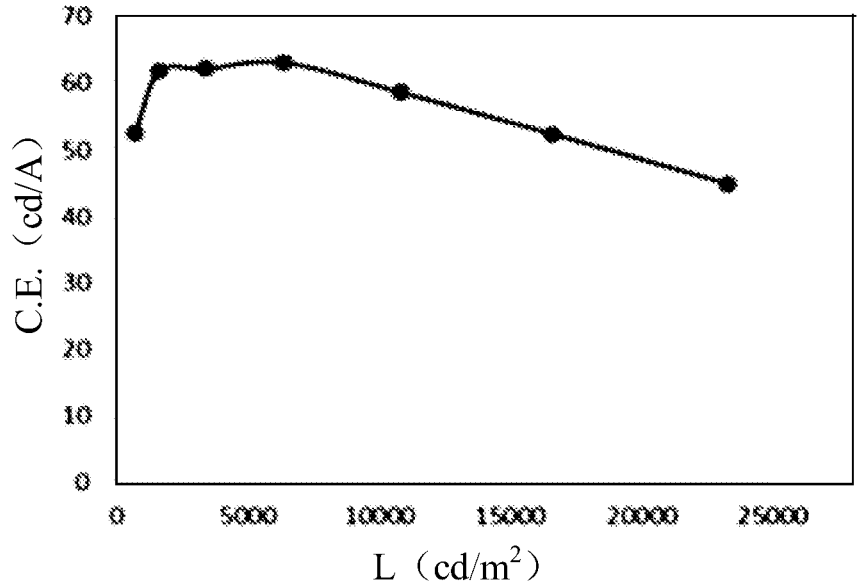

Optionally, FIG. 9 is a curve graph of change of light exiting brightness (L) of the QLED device along with change of working voltage (Voltage), and specifically shows a light exiting brightness change curve of the voltage in a range of 4-8 V; wherein FIG. 9(*a*) is a curve of change of light exiting brightness (L) of the conventional QLED device along with change of the working voltage (Voltage), and FIG. 9(*b*) is a curve of light exiting brightness (L) of the QLED device provided by the embodiment of the present disclosure along with change of working voltage (Voltage). FIG. 10 is a curve graph of current efficiency (C.E.) of the QLED device along with change of the light exiting brightness (L), and specifically shows a curve of change of the current efficiency of voltage in a range of 4-8 V along with change of the brightness; wherein FIG. 10(*a*) is a curve of change of the current efficiency (C.E.) of the conventional QLED device along with change of the light exiting brightness (L), and FIG. 10(*b*) is a curve of change of the current efficiency (C.E.) of the QLED device provided by the embodiment of the present disclosure along with change of the light exiting brightness (L).

As can be seen from comparison of (a) and (b) in FIG. 9, the light exiting brightness of the QLED device provided by the embodiment of the present disclosure is obviously improved and multiplied compared with that of the conventional QLED device, and specifically, when the working voltage is 5-6 v, the light exiting brightness of the QLED device provided by the embodiment of the present disclosure can even reach 10 times that of the conventional QLED device or above. As can be seen from comparison of (a) and (b) in FIG. 10, the current efficiency of the QLED device provided by the embodiment of the present disclosure is obviously improved compared with that of the conventional QLED device, and specifically, when the working voltage is 5-6 v, the current efficiency of the QLED device provided by the embodiment of the present disclosure is approximately 62 cd/A-63 cd/A and is about 2 times that of the conventional QLED device (32 cd/A-38 cd/A). In conclusion, experimental data results show that compared with a conventional QLED device, the QLED device provided by the embodiment of the present disclosure has the advantages that the light exiting brightness and the current efficiency are remarkably improved, and the performance of the QLED device can be effectively improved.

It will be apparent to those skilled in the art that various changes and modifications can be made in the embodiments of the present disclosure without departing from the spirit and scope of the present disclosure. Thus, if such modifications and variations of the present disclosure fall within the scope of the claims of the present disclosure and their equivalents, the present disclosure is also intended to include such modifications and variations.

The invention claimed is:

1. A quantum dot light-emitting device, comprising a first electrode layer, a quantum dot light-emitting layer, a second electrode layer and a third electrode layer which are sequentially arranged in a stacked mode, wherein
   a side, away from the first electrode layer, of the third electrode layer is configured as a light exiting side;
   the second electrode layer and the third electrode layer are transparent electrode layers;
   a Fermi energy level of the second electrode layer is smaller than a LUMO energy level of the quantum dot light-emitting layer and greater than a Fermi energy level of the third electrode layer;
   a thickness of the second electrode layer is 5%-20% of a thickness of the third electrode layer; and
   an oxygen content of material of the second electrode layer is smaller than an oxygen content of material of the third electrode layer.

2. The quantum dot light-emitting device according to claim 1, wherein the thickness of the second electrode layer is 1 nm-10 nm; and the thickness of the third electrode layer is 60 nm-100 nm.

3. The quantum dot light-emitting device according to claim 1, wherein the oxygen content of material of the second electrode layer is 0.

4. The quantum dot light-emitting device according to claim 1, further comprising an electron transport layer.

5. The quantum dot light-emitting device according to claim 4, wherein the electron transport layer is between the quantum dot light-emitting layer and the second electrode layer; and
   a LUMO energy level of the electron transport layer is smaller than the LUMO energy level of the quantum dot light-emitting layer and greater than the Fermi energy level of the second electrode layer.

6. The quantum dot light-emitting device according to claim 4, wherein the electron transport layer is between the quantum dot light-emitting layer and the first electrode layer.

7. The quantum dot light-emitting device according to claim 1, wherein an absolute value of a difference between the LUMO energy level of the quantum dot light-emitting layer and the Fermi energy level of the second electrode layer is larger than an absolute value of a difference between the Fermi energy level of the second electrode layer and the Fermi energy level of the third electrode layer.

8. The quantum dot light-emitting device according to claim 1, wherein the material of the second electrode layer is an indium zinc material; and the material of the third electrode layer is an indium zinc oxide material.

9. The quantum dot light-emitting device according to claim 4, wherein a material of the electron transport layer is zinc oxide nanoparticles or zinc oxide nanoparticles doped with magnesium.

10. A quantum dot light-emitting device, comprising a first electrode layer, a quantum dot light-emitting layer, a second electrode layer and a third electrode layer which are sequentially arranged in a stacked mode, wherein a side, away from the first electrode layer, of the third electrode layer is configured as a light exiting side;

the second electrode layer and the third electrode layer are transparent electrode layers;

a Fermi energy level of the second electrode layer is smaller than a LUMO energy level of the quantum dot light-emitting layer and greater than a Fermi energy level of the third electrode layer;

an oxygen content of material of the second electrode layer is 0; and a material of the third electrode layer is an indium zinc oxide material.

11. The quantum dot light-emitting device according to claim 10, wherein a thickness of the second electrode layer is smaller than a thickness of the third electrode layer.

12. The quantum dot light-emitting device according to claim 11, wherein the thickness of the second electrode layer is 5%-20% of the thickness of the third electrode layer.

13. The quantum dot light-emitting device according to claim 12, wherein the thickness of the second electrode layer is 1 nm-10 nm; and the thickness of the third electrode layer is 60 nm-100 nm.

14. The quantum dot light-emitting device according to claim 10, wherein the material of the second electrode layer is an indium zinc material.

15. The quantum dot light-emitting device according to claim 10, further comprising an electron transport layer.

16. The quantum dot light-emitting device according to claim 15, wherein the electron transport layer is between the quantum dot light-emitting layer and the second electrode layer; and a LUMO energy level of the electron transport layer is smaller than the LUMO energy level of the quantum dot light-emitting layer and greater than the Fermi energy level of the second electrode layer.

17. The quantum dot light-emitting device according to claim 15, wherein the electron transport layer is between the quantum dot light-emitting layer and the first electrode layer.

18. The quantum dot light-emitting device according to claim 10, wherein an absolute value of a difference between the LUMO energy level of the quantum dot light-emitting layer and the Fermi energy level of the second electrode layer is larger than an absolute value of a difference between the Fermi energy level of the second electrode layer and the Fermi energy level of the third electrode layer.

19. The quantum dot light-emitting device according to claim 15, wherein a material of the electron transport layer is zinc oxide nanoparticles or zinc oxide nanoparticles doped with magnesium.

20. The quantum dot light-emitting device according to claim 10, further comprises a base substrate, wherein the base substrate is on a side, away from the third electrode layer, of the first electrode layer; or the base substrate is positioned on a side, away from the first electrode layer, of the third electrode layer.

* * * * *